United States Patent [19]

Hersman

[11] Patent Number: 4,461,039

[45] Date of Patent: Jul. 17, 1984

[54] QUASI-OPTICAL BALANCED BICONICAL MIXER

[75] Inventor: Michael S. Hersman, Playa del Rey, Calif.

[73] Assignee: Hughes Aircraft Company, El Segundo, Calif.

[21] Appl. No.: 419,681

[22] Filed: Sep. 20, 1982

[51] Int. Cl.$^3$ ............................................. H04B 1/26
[52] U.S. Cl. .................................. 455/326; 307/425; 330/4.9; 332/7.51; 455/330; 455/619
[58] Field of Search ............... 455/323, 325, 326, 328, 455/330, 619; 333/26; 330/4.5, 4.6, 4.9; 307/424, 425, 427; 332/7.51

[56] References Cited

U.S. PATENT DOCUMENTS 4,229,828 10/1980 Baird et al. .......................... 455/326

OTHER PUBLICATIONS

Microwave Journal–vol. 23, No. 5 pp. 55–62, "New Trends in Millimeter Wave Mixer Technology" Paul et al., May 1980.
Microwave Systems News–vol. 9, No. 5, pp. 58–60, May 1979–"Quasi-Optical Mixer Offers Alternative'–'–Swanberg et al.
Electronic Design–vol. 23–Nov. 1977, pp. 26, 27–"Radio Receiver Reaches 670 GHZ with 'Quasioptics' and New Mixer Mount"–D. Hackmeister.
Society of Photo–Optical Instrumentation Engineers–vol. 105, pp. 40–43–"Receiver Design Principles'–'–Gustincic, 1977.

Primary Examiner—Marc E. Bookbinder
Attorney, Agent, or Firm—C. L. Anderson; W. J. Benman, Jr.; A. W. Karambelas

[57] ABSTRACT

A biconical antenna, the halves of which are connected together at the apex by a pair anti-parallel diodes through a pair of parallel conductive whiskers or wires. A pair of quasi-optical lenses focuses energy from a local oscillator and from a submillimeter radio source, respectively, onto the diode pair in the end-fire and broadside direction, respectively. The diode pair spacing is equal to the half wavelength of the local oscillator energy. The local oscillator energy is common mode rejected and causes the incoming radio energy to be sampled by forward biasing the anti-parallel diode pair in synchronism with each zero crossing of the local oscillator energy. Accordingly, the local oscillator energy and noise virtually do not affect the current flow between the halves of the biconical antenna. The current flow represents an intermediate frequency signal corresponding to the difference in frequency between the incoming radio signal frequency and the local oscillator frequency. Thus, local oscillator energy is mixed with incoming radio energy without permitting local oscillator noise to degrade the resulting mixed signal.

12 Claims, 3 Drawing Figures

QUASI-OPTICAL BALANCED BICONICAL MIXER

TECHNICAL FIELD

This invention is a quasi-optical mixer for a submillimeter wavelength radio receiver.

BACKGROUND OF THE INVENTION

Recent efforts have been made to develop receivers capable of operating in the relatively unused electromagnetic region between microwaves and infrared. It has been well-known to use waveguide technology in the microwave region in transmitters and receivers. However, a conventional microwave receiver, scaled to operate at 600 gegahertz (GHz) would need a rectangular waveguide of extremely small dimensions, on the order of 0.008 by 0.014 inches. Accordingly, waveguide technology is impractical for use in the submillimeter wavelength region above about 300 GHz. Further, waveguide receivers tend to be to lossy at these wavelengths. As a result, submillimeter wavelength receivers and transmitters are currently being developed which use, instead of the waveguide techniques, an optical approach involving the use of dielectric lenses (e.g., teflon). These devices are termed "quasi-optical". As described in Hacmeister, *Electronics Design*, Vol. 23, Nov. 8, 1977, pages 26 and 27, a teflon lens focuses the submillimeter wavelength energy into a spherical resonant cavity where it is sensed using a whisker antenna and a Schottky diode.

One problem with such a quasi-optical submillimeter receiver is that the incoming radio energy must be mixed with a local oscillator in order to convert the signal to a lower intermediate frequency (IF) for further processing. In order to generate a local oscillator signal suitable for submillimeter wavelengths, an impatt diode source can be used, which is well known to be inherently noisy. In order to avoid degradation of the signal from such noise, it has been necessary to employ special filters or other methods for minimizing or at least reducing the local oscillator noise present in the signal.

A quasi-optical receiver is disclosed in Gustincic, "Receiver Design Principles", *Society of Photo-optical Instrumentation Engineering*, Vol. 105 (1977), pages 40–43. In the Gustincic publication, a quasi-optical lens assembly is combined with a biconical antenna in a submillimeter single-ended mixer. In this single ended mixer, incoming radio energy is mixed with local oscillator energy to down-convert the signal in accordance with the usual superheterodyning principles It is a purpose of the present invention to provide a quasi-optical receiver in which local oscillator noise is suppressed and does not degrade the quality of the signal produced in the receiver.

SUMMARY OF THE INVENTION

In the present invention, the two cones of a biconical antenna are connected together at each apex by a pair of anti-parallel diodes through a pair of parallel conductive whiskers or wires. A pair of quasi-optical lenses focuses energy from a local oscillator and a submillimeter signal source, respectively, onto the diode pair. One of the quasi-optical lenses directs the local oscillator energy end-fire toward the diode pair and the other directs the incoming radio energy broadside toward the diode pair. The spacing between the diode pair is equal to the half-wavelength of the local oscillator energy or an odd multiple thereof. The local oscillator energy enables current flow in opposite directions through the two anti-parallel diodes simultaneously at a frequency equal to the frequency of the local oscillator energy. As a result, the incoming radio energy is sampled by the biconical antenna pair at a frequency equal to the local oscillator frequency.

An advantage of the invention is that the simultaneous current flow through the anti-parallel diode pair in opposite directions suppresses the local oscillator by common mode rejection. For example, in the absence of any incoming radio energy, the local oscillator energy causes equal and opposite currents to flow through the two anti-parallel diodes simultaneously. Accordingly, the current flow through them is precisely balanced to a null so that the local oscillator is suppressed and thus the current flow is virtually free of local oscillator noise, a significant advantage.

The quasi-optical lenses comprise a pair of teflon lenses in the preferred embodiment. A teflon lens having its optical axis oriented end-fire with respect to the anti-parallel diode pair focuses the local oscillator energy thereon. A second teflon lens having its optical axis oriented broadside with respect to the anti-parallel diode pair focuses the incoming radio energy thereon. A pair of backstop conductive mirrors located on the opposite side of the biconical antenna pair and facing the teflon lenses causes reflection of the radio energy in a manner designed to increase the coupling of the incoming radio energy to the diode pair.

Local oscillator energy is prevented from escaping or coupling through the second lens while the incoming radio frequency energy is prevented from escaping or coupling through the first lens by means of the antenna pattern effects of the anti-parallel diode and whisker pair combination. The pair of conductive whiskers are driven in phase by the incoming radio energy so as to generate a pattern null of incoming radio energy in the direction of the first or local oscillator lens. The same pair of whiskers are driven out of phase by the local oscillator energy so as to generate a pattern null of local oscillator energy in the direction of the second or incoming radio lens. Accordingly, the arrangement of this invention effectively isolates the two lenses and prevents energy losses through cross coupling therethrough.

BRIEF DESCRIPTION OF THE DRAWINGS

The invention is best understood by reference to the accompanying drawings, of which.

DETAILED DESCRIPTION OF THE INVENTION

Figure 1:
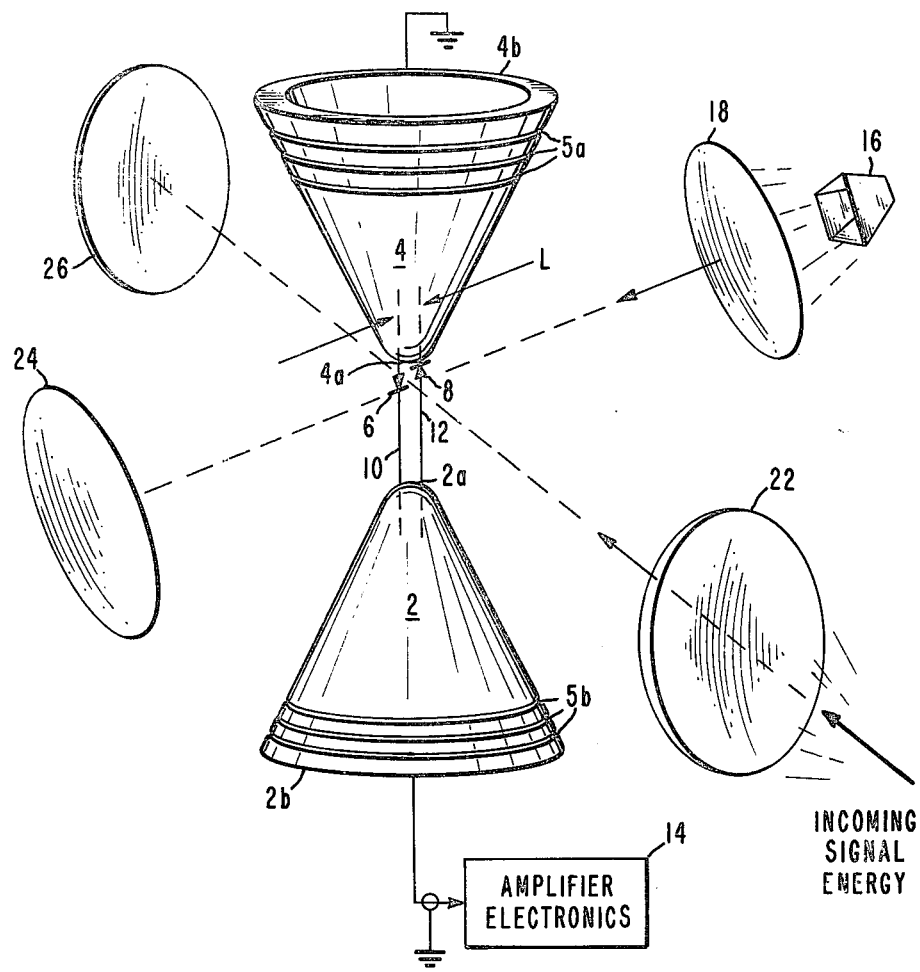
FIG. 1 is a perspective view of the biconical mixer of the present invention.
Figure 2:
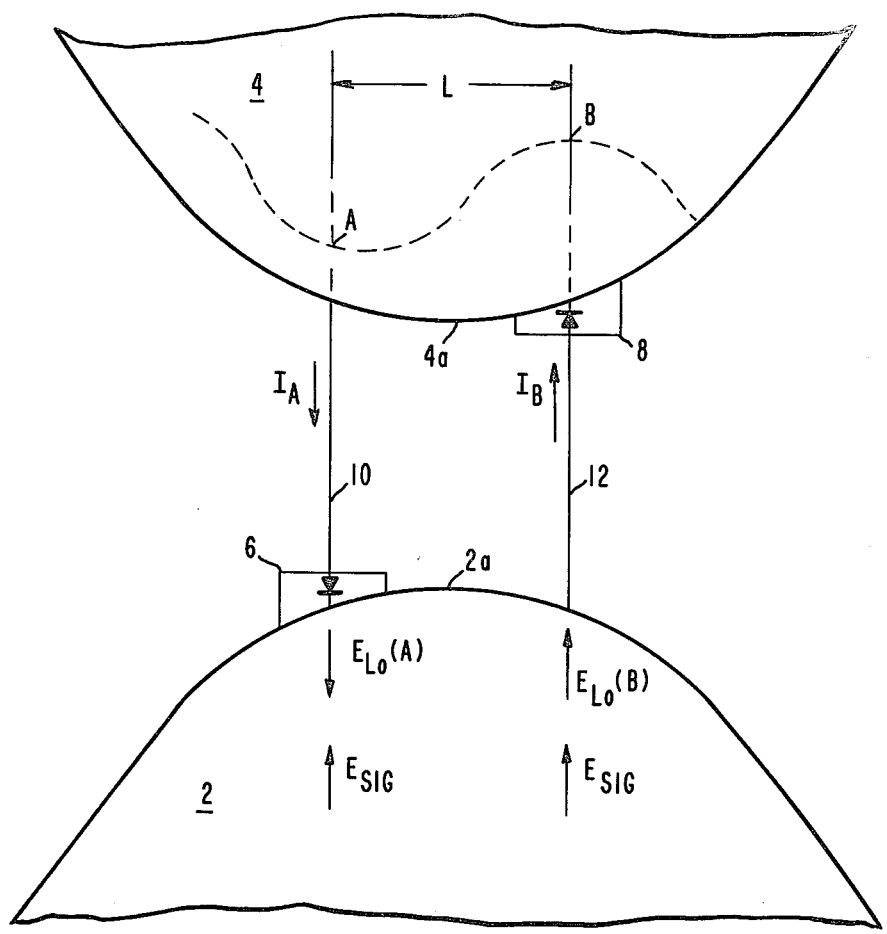
FIG. 2 is an enlarged view of a portion of FIG. 1 illustrating the anti-parallel diodes of FIG. 1.

Referring to FIG. 1, the mixer of this invention includes a pair of biconical antenna cones 2, 4, comprising copper or another suitable conductive material, and each having a set of choke grooves 5a, 5b formed in its surface. The apex 2a, 4a of each of the antenna cones 2, 4, faces that of the other. A pair of anti-parallel diodes 6, 8, best shown in FIG. 2, is connected to the surface of each apex 2a, 4a, respectively, each being connected by a wire whisker 10, 12, respectively, to the apex of the opposite cone. The base 4b of the top cone 4 is connected to ground while the base 2b of the bottom cone 2 is connected to the amplifier electronics. The amplifier electronics amplifies the current flow through the diode pair, which is the intemediate frequency (IF) mixer output.

A feedhorn 16 directs local oscillator energy, which is focused through a teflon lens 18 onto the whiskers 10, 12 in a direction parallel to the displacement between the whiskers 10, 12, which direction shall be termed "end-fire" in this specification. Incoming signal energy is focused by teflon lens 22 onto the wire whisker pair 10, 12 in a direction perpendicular with respect to the spacing between the whisker pair 10, 12, which direction shall be termed "broadside" as used in this specification. A pair of conductive mirrors 24, 26 reflects the energy focused through the lenses 18, 22, respectively, back into the region coupled by the wire whisker pair 10, 12. The local oscillator energy has a wavelength $\lambda$ equal to twice the spacing L between the wire whisker pair 10, 12.

The incoming radio energy has a wavelength of less than a millimeter (between the microwave and infrared electromagnetic regions), and may contain, for example, both a carrier and a signal. The mixer of FIG. 1 generates an intermediate frequency (IF) signal having a frequency equal to the difference between the frequency of the incoming radio energy and the frequency of the local oscillator energy, the IF signal being sensed by the amplifier electronics 14.

Local oscillator energy fed through the horn 16 includes a sine wave component of wavelength $\lambda$ and some undesirable noise. The most practical submillimeter wavelength local oscillator signal generator uses an impatt diode of the type well known in the art, which produces a significant amount of undesirable noise. In the present invention, the arrangement illustrated in FIGS. 1 and 2 of the opposing biconical antennas 2, 4 and the anti-parallel diodes 6, 8 suppresses the local oscillator energy by common mode rejection.

Common Mode Rejection of Local Oscillator Noise

Referring to FIGS. 1 and 2, local oscillator energy focused end-fire through the lens 18 arrives at the first whisker 12 before it arrives at the second whisker 10. The delay corresponds to a phase difference of 180°. The local oscillator energy waveform may be characterized as a sine wave (indicated in dashed line in FIG. 2) having a half wavelength $\lambda/2$ corresponding to the whisker spacing L. A positive-going peak (B) of the local oscillator energy at the whisker 12 coincides in time to a negative-going peak (A) equal magnitude at the whisker 10. The local oscillator energy imposes electric fields of opposite phase, $E_{LO}(A)$ and $E_{LO}(B)$ across the whiskers 10, 12, as illustrated in FIGS. 3a and 3b, respectively. Because the diodes 6 and 8 are connected to the whiskers 10 and 12, respectively, in anti-parallel fashion, the two diodes are periodically forward biased (rendered conductive) simultaneously by the local oscillator electric fields $E_{LO}(A)$ and $E_{LO}(B)$. The electric fields $E_{LO}(A)$ and $E_{LO}(B)$ therefore generate equal and opposite local oscillator currents $I_A$, $I_B$ in the wire whiskers 10, 12, respectively, in the absence of incoming radio energy or other radiation. The equal and opposite local oscillator currents $I_A$, $I_B$ cancel one another so that no net current flows between the two antennas 2, 4 in the sole presence of local oscillator energy and the electronics 14 do not sense any current. In this manner, the local oscillator energy is suppressed by common mode rejection.

A significant advantage of the invention is that the net current flow between the two conical antennas 2, 4 is virtually unaffected by the local oscillator signal and local oscillator noise because both the local oscillator signal and noise are suppressed by common mode rejection. The local oscillator noise which presents the greatest threat of signal distortion is that which is close in frequency to the local oscillator frequency. This noise is common mode rejected by virtue of the alignment and spacing of the antenna whiskers 10, 12, as previously described.

Sampling of the Incoming Radio Energy

The lens 22 focuses incoming radio energy onto the wire whiskers 10, 12 in the broadside direction, which induces an electric field $E_{sig}$ (corresponding to the incoming radio energy) across both whiskers 10, 12 simultaneously.

Figure 3:
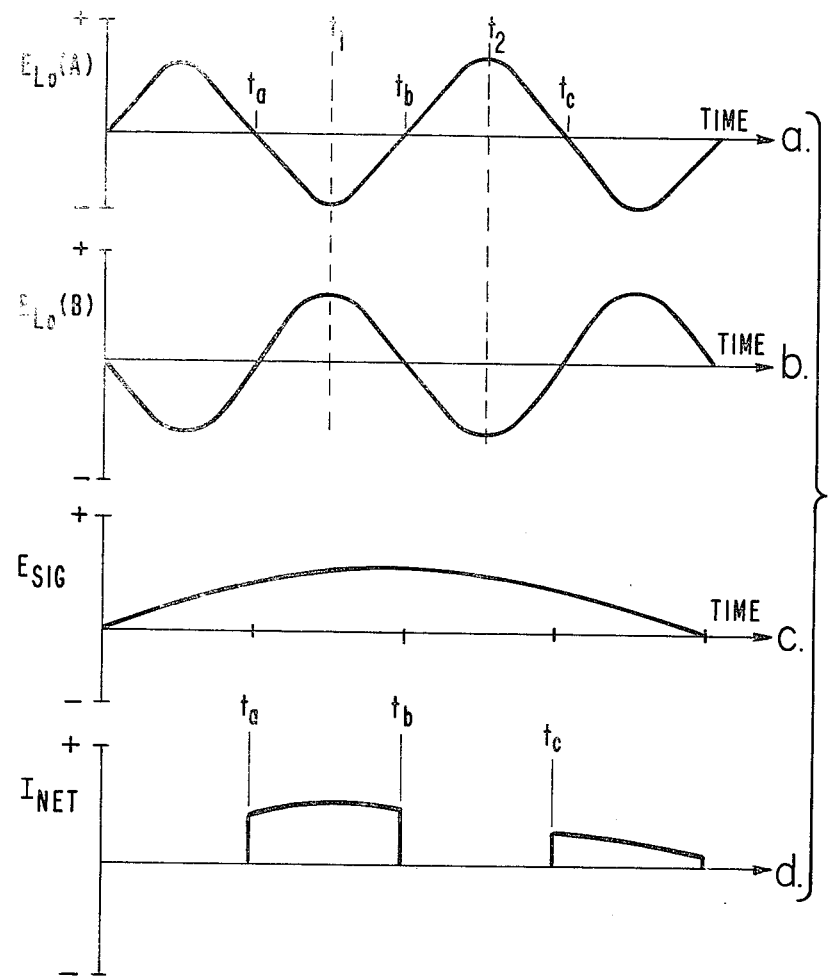
FIG. 3a is a diagram of the time domain waveform of the local oscillator electric field at one of the two anti-parallel diodes.
FIG. 3b is a diagram of the time domain waveform of the local oscillator electric field at the other of the anti-parallel diodes.
FIG. 3c is a diagram of an exemplary incoming radio energy waveform.
FIG. 3d is a diagram of the time domain waveform of the net current across the biconical antenna pair of FIG. 1 in the presence of the incoming radio energy waveform of FIG. 3c.

FIG. 3 illustrates an exemplary waveform of the incoming radio electric field $E_{sig}$. The incoming radio energy is "sampled" by the mixer of FIG. 1 at the frequency of the local oscillator electric field. Referring to FIGS. 3a, b, c and d, the anti-parallel diode pair is forward biased beginning at the zero crossing of the electric field $E_{LO}(A)$ and $E_{LO}(B)$ at time $t_a$ of FIGS. 3a and 3b, until their next zero crossing at time $t_b$. During this time period, the net current illustrated in FIG. 3d between antenna cone pair 2, 4 is the current $i_{sig}$ induced by the incoming electric field $E_{sig}$ illustrated in FIG. 3c. Thereafter, the anti-parallel diode pair 6, 8 is reverse biased beginning with the zero-crossing at time $t_b$ of $E_{LO}(A)$ and $E_{LO}(B)$ until their next zero crossing at time $t_c$, during which interval the net current is zero, as illustrated in FIG. 3d.

The resulting current $I_{net}$ of FIG. 3d represents a intermediate frequency (IF) signal having a frequency component corresponding to the difference in frequencies of the incoming radio energy and the local oscillator energy, and comprises the output signal of the biconical mixer of FIG. 1 sensed and amplified by the electronics 14. The waveform of the net output current $I_{net}$ of FIG. 3d generally follows the waveform of the incoming radio electric field $E_{sig}$ of FIG. 3c during each sampling period, although same minor phase differences may be present which are not shown in FIGS. 3c and 3d.

The magnitude of the local oscillator electric field must be sufficient to guarantee that the forward and reverse biasing of the anti-parallel diode pair occurs at the zero crossings of the local oscillator electric field, regardless of the strength of the incoming radio electric field. Generally, the local oscillator electric field magnitude will be much greater than the incoming radio electric field magnitude.

During the instant in time corresponding to the example illustrated in FIG. 2, the incoming radio energy electric field $E_{sig}$ is oriented in an upward direction as illustrated in FIG. 2. This instant in time corresponds to time $t_1$ of FIGS. 3a, 3b, 3c and 3d. Simultaneously, in accordance with the dashed line waveform of FIG. 2, the local oscillator electric field $E_{LO}(A)$ at the wire whisker 10 points "down" while the local oscillator electric field $E_{LO}(B)$ at the wire whisker 12 points "up". Accordingly, both diodes are forward biased so that, in addition to the equal and opposite local oscillator currents $I_a$, $I_b$ flowing through the wire whiskers 10, 12, respectively, an additional current $I_{sig}$ induced by the incoming radio electric field $E_{sig}$ flows upwardly through the wire whisker 12. Therefore, a net current $I_{sig}$ flows between the conical antennas 2, 4. Accordingly, at time $t_1$ the net current flow of FIG. 3d has a magnitude $I_{sig}$ corresponding to the electric field $E_{sig}$. At time $t_2$, the electric field across each of the anti-parallel diodes 6, 8 has reversed so that both diodes are reversed biased, which prohibits any current flow therethrough. Accordingly, at time $t_2$, the net current flow between the conical antennas 2, 4 of FIG. 3d is zero. Thus, it is seen that during the sampling period from time $t_a$ to time $t_b$ when the diode 6, 8 are forward biased, the net current of FIG. 3d follows the waveform of the incoming radio electric field of FIG. 3c.

Energy Loss Prevention by Mutual Isolation of the Local Oscillator and Incoming Radio Ports The lenses 18, 22 correspond to input ports for the local oscillator energy and the incoming RF energy, respectively. In order to reduce energy losses, it is necessary to prevent local oscillator energy reflected by the mirror 24 or 26 from exiting through the lens 22. It is also necessary to prevent the incoming radio energy reflected by the mirrors 26 or 24 from exiting through the lens 18. In other words, each of the signals focused in on the whisker pair 10, 12 through the lenses (or input ports) 18, 22, respectively, must be prevented from coupling back out through the input port of the other signal.

In the present invention, almost no such coupling occurs because of the antenna radiation pattern of the whisker pair 10, 12, which is established in accordance with well known antenna radiation theory. Specifically, the incoming radio energy focused through the lens or input port 22 drives the whisker pair 6, 8 in phase as a pair of radiators having an antenna pattern null in the end-fire direction (in the direction of the local oscillator input port or lens 18). Accordingly, virtually none of the incoming radio energy is coupled to the local oscillator input port or lens 18. Also, the local oscillator energy focused through the input port or lens 18 drives the whiskers 6, 8 as a pair of radiators 180° out of phase having an antenna pattern null in the broadside direction (in the direction of the incoming RF input port or lens 22). Accordingly, none of the local oscillator energy focused through the local oscillator input port or lens 18 is coupled through the incoming radio energy input port or lens 22.

What is claimed is:

1. A balanced mixer comprising:
   a pair of conductive antenna bodies, each having an apex facing the apex of the other;
   a pair of anti-parallel diodes, each connected between the apexes of said pair of antenna bodies;
   means for focusing incoming radio energy into the vicinity of said anti-parallel diode pair in the broadside direction with respect thereto;
   means for focusing local oscillator energy into the vicinity of said anti-parallel diode pair in the end-fire direction with respect thereto; and
   means for sensing current flow between said antenna body pair.

2. The device of claim 1 further comprising means located on the opposite side of said antenna body pair with respect to said local oscillator energy focusing means for reflecting said local oscillator energy back into the vicinity of said anti-parallel diode pair.

3. The device of claim 1 or 2 further comprising means located on the opposite side of said antenna body pair with respect to said incoming radio energy focusing means for reflecting said incoming radio energy back into the vicinity of said anti-parallel diode pair.

4. The device of claim 1 wherein said local oscillator energy focusing means and said incoming radio energy focusing means comprise teflon lenses.

5. The device of claim 1 wherein said antenna body pair comprise a pair of conical conductive bodies.

6. The device of claim 5 wherein said conical bodies are comprised of copper having choke grooves formed in the surface thereof, their apexes facing each other, the base of one of said bodies being connected to ground and the base of the other being connected to amplifier electronics.

7. The device of claim 1 further comprising a feedhorn directing said local oscillator energy towards said local oscillator energy focusing means.

8. The device of claim 1 wherein said anti-parallel diode pair are separated from each other by a distance on the order of a one-half wavelength of said local oscillator energy.

9. The device of claim 1 wherein said anti-parallel diode pair are separated from each other by a distance on the order of an odd multiple of a one-half wavelength of said local oscillator energy.

10. A balanced mixer comprising:
    a pair of conductive antenna bodies, each having a base and an apex facing the apex of the other, the base of one being connected to a reference potential and the base of the other being connected to amplifier electronics;
    means for connecting a pair of anti-parallel diodes between the apexes of said pair of antenna bodies; and
    means for focusing incoming radio energy and local oscillator energy into the vicinity of said anti-parallel diode connecting means in the broadside and end-fire directions, respectively, with respect thereto.

11. The balanced mixer of claim 10 wherein said anti-parallel diode connecting means comprise a pair of conductors spaced apart from one another by distance on the order of a half wavelength of said local oscillator energy or an odd multiple thereof.

12. The balanced mixer of claim 10 wherein said incoming radio energy and said local oscillator energy focusing means comprise a pair of teflon lenses having their principal optical axes disposed in said broadside and end-fire directions respectively.

* * * * *